(12) United States Patent
Noto et al.

(10) Patent No.: US 7,557,654 B2
(45) Date of Patent: Jul. 7, 2009

(54) LINEARIZER

(75) Inventors: Hifumi Noto, Tokyo (JP); Kazuhisa Yamauchi, Tokyo (JP); Yoshihiro Hamamatsu, Tokyo (JP); Tomokazu Hamada, Tokyo (JP); Masatoshi Nakayama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 144 days.

(21) Appl. No.: 11/660,136

(22) PCT Filed: Oct. 28, 2004

(86) PCT No.: PCT/JP2004/016033

§ 371 (c)(1),
(2), (4) Date: Feb. 13, 2007

(87) PCT Pub. No.: WO2006/046294

PCT Pub. Date: May 4, 2006

(65) Prior Publication Data
US 2007/0241815 A1 Oct. 18, 2007

(51) Int. Cl.
H03F 1/26 (2006.01)
H03F 1/30 (2006.01)

(52) U.S. Cl. .................................................. 330/149

(58) Field of Classification Search .................. 330/149
See application file for complete search history.

(56) References Cited

U.S. PATENT DOCUMENTS 3,849,676 A * 11/1974 Bareyt ........................ 327/233
4,679,003 A * 7/1987 Sagawa et al. .............. 331/1 A
4,752,743 A * 6/1988 Pham et al. ................. 330/149
4,890,300 A * 12/1989 Andrews ..................... 375/297
5,210,633 A * 5/1993 Trisno ........................ 398/193

(Continued)

FOREIGN PATENT DOCUMENTS

JP 61-68517 U 5/1986

(Continued)

OTHER PUBLICATIONS

Kazuhisa Yamauchi et al., IEICE Trans. Electron, vol. E86 C, No. 8 Aug. 2003.

(Continued)

*Primary Examiner*—Robert Pascal
*Assistant Examiner*—Krista M Flanagan
(74) *Attorney, Agent, or Firm*—Birch, Stewart, Kolasch & Birch, LLP

(57) ABSTRACT

A linearizer changes a gain characteristic to a valley characteristic in which a gain reduces and then increases. The linearizer includes: a signal path in which an RF signal input terminal an input side bias blocking capacitor, a diode pair, including diodes having opposite polarities to each other, an output side bias blocking capacitor and an RF signal output terminal in series in the stated order; a bias circuit in which a resistor is provided between and a signal path formed between the input side bias blocking capacitor and the diode pair and a bias terminal; an RF short-circuiting capacitor whose one end is connected with the bias circuit between the bias terminal and the resistor and whose other end is grounded; and a DC feed inductor whose one end is connected with the signal path between the diode pair and the output side bias blocking capacitor and whose other end is grounded.

12 Claims, 15 Drawing Sheets

U.S. PATENT DOCUMENTS

| | | | |
|---|---|---|---|
| 5,523,716 A | 6/1996 | Grebliunas et al. | |
| 5,600,472 A * | 2/1997 | Uesaka | 398/158 |
| 5,798,854 A * | 8/1998 | Blauvelt et al. | 398/194 |
| 6,107,877 A * | 8/2000 | Miguelez et al. | 330/66 |
| 6,255,905 B1 * | 7/2001 | Gehrt | 330/107 |
| 6,288,814 B1 * | 9/2001 | Blauvelt | 398/193 |
| 6,307,436 B1 * | 10/2001 | Hau | 330/149 |
| 6,313,701 B1 * | 11/2001 | Mussino et al. | 330/149 |
| 6,570,430 B1 * | 5/2003 | Zhou | 327/317 |
| 6,577,177 B2 * | 6/2003 | Zhou et al. | 327/317 |
| 6,580,319 B1 * | 6/2003 | Cummings et al. | 330/149 |
| 7,057,464 B2 * | 6/2006 | Bharj | 330/302 |
| 7,332,961 B2 * | 2/2008 | Blednov | 330/149 |
| 7,385,447 B1 * | 6/2008 | Adar | 330/149 |

FOREIGN PATENT DOCUMENTS

| | | |
|---|---|---|
| JP | 1-200807 A | 8/1989 |
| JP | 5-23612 U | 3/1993 |
| JP | 8-181544 A | 7/1996 |
| JP | 9-130236 A | 5/1997 |
| JP | 9-232901 A | 9/1997 |
| JP | 2002-076784 A | 3/2002 |

OTHER PUBLICATIONS

Yamauchi et al., 1996 IEEE MTTS—Digect WE3F-6 pp. 831-834.

\* cited by examiner

*Prior Art*

*Prior Art*

LINEARIZER

TECHNICAL FIELD

The present invention relates to a linearizer which is applied to an amplifier for satellite communication, an amplifier for mobile communication, and an amplifier for terrestrial microwave communication and used for a low-distortion amplifier for compensating for amplitude nonlinearity or phase nonlinearity.

BACKGROUND ART

FIG. 23 is a circuit diagram showing a linearizer according to a first conventional example (see, for example, Patent Document 1). The linearizer according to the first conventional example as shown in FIG. 23 includes: a signal path in which an input terminal 1 into which a radio frequency band signal (RF signal) is inputted, an input side bias blocking capacitor 4, a diode 8, an output side bias blocking capacitor 5, and an output terminal 2 from which the radio frequency band signal is outputted are connected in series in the stated order; a bias circuit in which a first resistor 7 is connected between a signal path formed between the input side bias blocking capacitor 4 and the diode 8 and a bias terminal 3; an RF short-circuit capacitor 6 whose one end is connected with a bias circuit between the bias terminal 3 and the first resistor 7 and whose other end is grounded; a bias short-circuit inductor 11 whose one end is connected with a signal path formed between the diode 8 and the output side bias blocking capacitor 5 and whose other end is grounded; and a series circuit composed of a second resistor 9 and a first capacitor 10 which are connected in parallel with the diode 8.

This linearizer is an example of an analog predistortion linearizer. The linearizer is connected in series with an amplifier in the preceding or subsequent stage thereof. Then, the distortion of the amplifier having a characteristic in which a gain is increased with an increase in input power and a phase is delayed therewith is compensated by the linearizer. According to the linearizer, when a bias voltage, a value of the resistor 9, and a value of the capacitor 10 are changed, an input power-gain characteristic (AM-AM characteristic) and an input power-phase characteristic (AM-PM characteristic) can be adjusted.

FIG. 24 is a circuit diagram showing a linearizer according to a second conventional example (see, for example, Patent Document 2). In FIG. 24, the same reference numerals are applied to the same portions as those shown in FIG. 23 and the description thereof is omitted here. In the linearizer according to the second conventional example as shown in FIG. 24, two diodes 8 and 12 are used in parallel with opposite polarities to each other with respect to the RF signal. A direct current bias is connected in series with each diode in the forward polarity direction. Resistors 21 and 22 are provided in parallel with the diodes 8 and 12. The bias is applied through each of resistors 19 and 20.

When the above-mentioned linearizer is connected in series with an amplifier in the preceding or subsequent stage thereof, the distortion of the amplifier having a characteristic in which a gain is increased with an increase in input power and a phase is delayed therewith is compensated by the linearizer. When values of the resistors 21 and 22 are changed, the input power-gain characteristic (AM-AM characteristic) and the input power-phase characteristic (AM-PM characteristic) can be finely adjusted.

FIG. 25 is a circuit diagram showing a linearizer according to a third conventional example (see, for example, Patent Document 3). In FIG. 25, the same reference numerals are applied to the same portions as those shown in FIG. 23 and the description thereof is omitted here. In the linearizer according to the third conventional example as shown in FIG. 25, two diodes 23 and 24 form a diode pair provided in parallel with opposite polarities to each other and one terminal of each thereof is grounded with respect to the RF signal. Resistors 31 and 32 are used for a voltage divider.

FIG. 26 is a circuit diagram showing a harmonic mixer according to a fourth conventional example (see, for example, Patent Document 4). In the harmonic mixer according to the fourth conventional example as shown in FIG. 26, a low-pass lifter 28 and a DC cut 27 are provided on a path between an IF input terminal 30 and an IF input terminal 29. Two diodes 23 and 24 connected in parallel with opposite polarities to each other and a line 25 having a λ/4 wavelength relative to a local signal are provided between a connecting point between the low-pass lifter 28 and the DC cut 27 and ground. Reference numeral 26 denotes a line having the λ/4 wavelength relative to the local signal and 31 denotes a local signal input terminal.

Patent Document 1: JP 2002-76784 A (FIG. 1)
Patent Document 2: Japanese Utility Model Application Laid-open No. Sho 61-68517 (FIG. 1)
Patent Document 3: Japanese Utility Model Application Laid-open No. Hei 05-023612 (FIG. 1)
Patent Document 4: JP 09-130236 A (FIG. 5)

DISCLOSURE OF THE INVENTION

Problems to be Solved by the Invention

In the first conventional example as described above, the bias voltage of the linearizer shown in FIG. 23, the value of the resistor 9, and the value of the capacitor 10 are changed to adjust the input power-gain characteristic (AM-AM characteristic) and the input power-phase characteristic (AM-PM characteristic).

However, when the linearizer having the structure shown in FIG. 23 is applied to an amplifier having a gain characteristic as shown in FIG. 27, the gain characteristics of the linearizer and the amplifier reduce in a high input region. Therefore, there is a problem in that output power at a specific gain compression point (for example, $P_{2dB}$: 2dB gain compression point) corresponding to a point in which the gain is lowered from a linear gain by 2 dB reduces.

This principle will be described with reference to the drawings.

When the linearizer according to the first conventional example is to be used for the amplifier having the gain characteristic as shown in FIG. 27, the linearizer is used to flatten a region in which the gain increases in the gain characteristic shown in FIG. 27. In order to flatten the gain of the amplifier, it is necessary to change the gain characteristic of the linearizer to a characteristic reverse to the gain characteristic of the amplifier. In the linearizer according to the first conventional example, the voltage applied to the diode 8, the value of the resistor 9, and the value of the capacitor 10 are adjusted to obtain the characteristic reverse to the gain characteristic of the amplifier. The characteristic of the linearizer which is obtained at this time is shown in FIG. 28.

When the linearizer having the gain characteristic as shown in FIG. 28 is applied to the amplifier having the gain characteristic as shown in FIG. 27, a gain characteristic is that shown in FIG. 29. Here, specific gain compression points are expressed by boxes in FIG. 29. It is apparent that an input level at the specific gain compression point in the gain characteristic obtained after the application of the linearizer becomes lower than that at the specific gain compression point in the original gain characteristic (solid line) of the amplifier. In other words, in FIG. 30 showing input and output characteristics of the amplifier, an output level at the specific gain compression point becomes lower than that in the original characteristic of the amplifier. When the amplifier provided with the linearizer is applied to, for example, a feedforward amplifier, the specific gain compression point lowers. Therefore, it is necessary to use an amplifier having a higher output, so there is a problem in that power efficiency decreases and a circuit area become larger.

In the second conventional example shown in FIG. 24, although the polarities of the pair of two diodes 8 and 12 become opposite to each other with respect to the RF signal, a forward bias is applied in a case of a direct current bias. Therefore, when RF power becomes larger, an internal resistance value of the diode 8 with respect to the signal is increased by the voltage drop of the resistor 19. As a result, the gain characteristic of the linearizer reduces with respect to input power. The amount of reduction can be adjusted using the parallel resistors 21 and 22. However, the gain characteristics of the linearizer and the amplifier reduce in the high input region. Thus, there is a problem in that the output power at the specific gain compression point reduces.

In the third conventional example shown in FIG. 25, the two resistors 31 and 32 operate as a voltage dividing circuit. The voltage dividing circuit is connected with the pair of diodes 23 and 24. In a case where the linearizer according to the third conventional example is used, when an input signal is small, a voltage applied to the diodes is lower than a diode forward voltage, so the input signal is outputted without any change. On the other hand, when the input signal is large, the voltage applied to the diodes becomes higher, so the waveform of the signal is clipped. Therefore, when the amplitude of the input signal increases, the output signal becomes smaller than the input signal. In other words, the gain characteristic reduces with the increase in amplitude of the signal. The amount of gain reduction can be adjusted using the resistors. However, the gain characteristics of the linearizer and the amplifier reduce in the high input region. Thus, there is a problem in that the output power at the specific gain compression point reduces.

In the fourth conventional example, the two diodes 23 and 24 are used as a part of a mixer, so a bias is not applied. The two diodes 23 and 24 are provided to cancel a second harmonic of the local signal by the rectifying action of the diodes. Therefore, the diodes 23 and 24 are not operated as the linearizer.

The present invention has been made to solve the above-mentioned problems in the conventional examples. It is therefore an object of the present invention to provide a linearizer capable of changing a gain characteristic to a valley characteristic in which a gain reduces and then increases.

Means for Solving the Problem

A linearizer according to the present invention includes: a signal path in which an RF signal input terminal, an input side bias blocking capacitor, a diode pair including diodes having opposite polarities to each other, an output side bias blocking capacitor, and an RF signal output terminal are connected in series in a stated order; a bias circuit in which a resistor is provided between a signal path formed between the input side bias blocking capacitor and the diode pair and the bias terminal; an RF short-circuit capacitor whose one end is connected with the bias circuit between the bias terminal and the resistor and whose other end is grounded; and a DC feed inductor whose one end is connected with a signal path formed between the diode pair and the output side bias blocking capacitor and whose other end is grounded.

Effects of the Invention

According to the present invention, a pass gain characteristic or a pass phase characteristic is adjusted based on a bias voltage applied from the bias terminal. Therefore, the gain characteristic can be changed to the valley characteristic in which the gain reduces and then increases.

BEST MODES FOR CARRYING OUT THE INVENTION

Embodiment 1

Hereinafter, embodiments of the present invention will be described with reference to the accompanying drawings.

Figure 1:
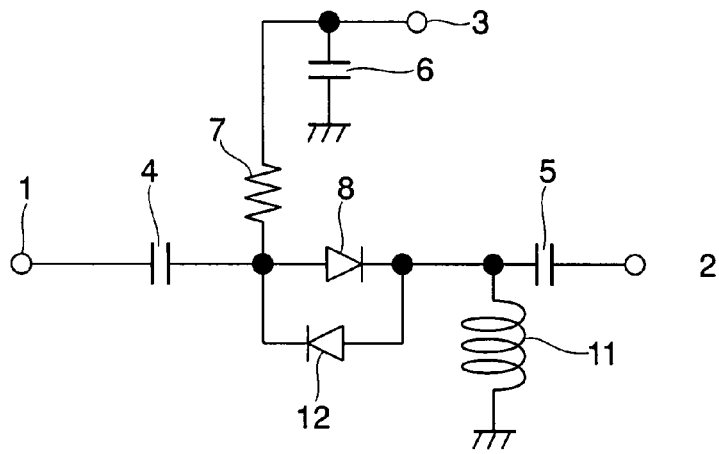
[FIG. 1] A circuit diagram showing a linearizer according to Embodiment 1 of the present invention.
Figure 2:
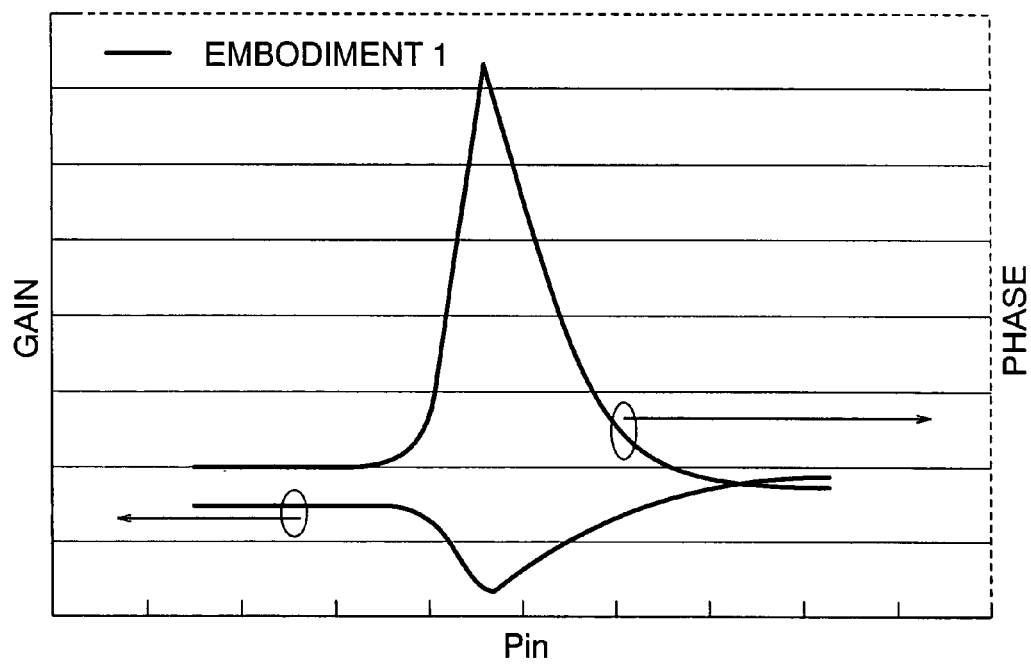
[FIG. 2] A characteristic diagram showing a gain characteristic and a phase characteristic of the linearizer according to Embodiment 1 of the present invention.

FIG. 1 is a circuit diagram showing a linearizer according to Embodiment 1 of the present invention. FIG. 2 is a characteristic diagram showing a gain characteristic (Gain) and a phase characteristic (Phase) with respect to signal power Pin, of the linearizer according to Embodiment 1 of the present invention.

The linearizer shown in FIG. 1 includes: a signal path in which an RF signal input terminal 1, an input side bias blocking capacitor 4, a pair of diodes 8 and 12 having opposite polarities to each other, an output side bias blocking capacitor 5, and an RF signal output terminal 2 are connected in series in the stated order; a bias circuit in which a resistor 7 is provided between a signal path formed between the input side bias blocking capacitor 4 and the pair of diodes 8 and 12 and a bias terminal 3; an RF short-circuit capacitor 6 whose one end is connected with a bias circuit between the bias terminal 3 and the first resistor 7 and whose other end is grounded; and a DC feed inductor 11 whose one end is connected with a signal path formed between the pair of diodes 8 and 12 and the output side bias blocking capacitor 5 and whose other end is grounded. A pass gain characteristic or a pass phase characteristic is adjusted based on a bias voltage applied from the bias terminal 3.

In the circuit shown in FIG. 1, when a positive bias is applied from the bias terminal 3, a forward bias is applied to the diode 8 through the resistor 7 and a reverse bias is applied to the diode 12 therethrough. When the signal power Pin is inputted from the RF signal input terminal 1, the signal waveform is clipped by the diode 8 to generate a DC current. Voltage drop is caused in the resistor 7 by the DC current to reduce the bias voltage applied to the diode 8, so an internal resistance value of the diode 8 with respect to the signal increases.

Figure 3:
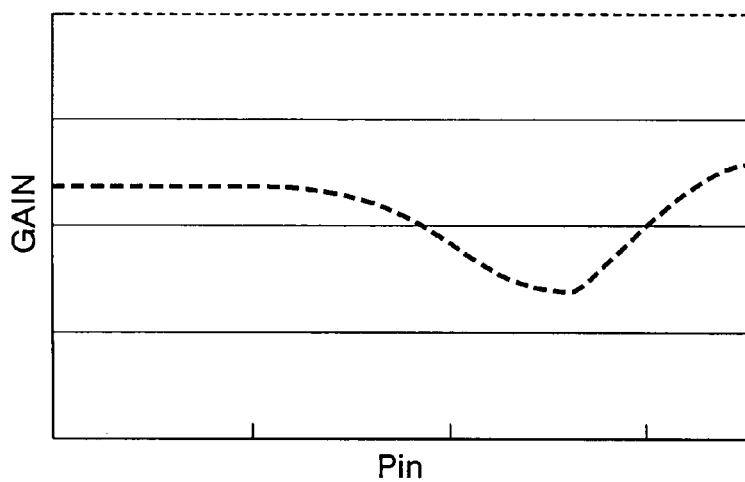
[FIG. 3] A diagram showing the gain characteristic of the linearizer according to the present invention.
Figure 4:
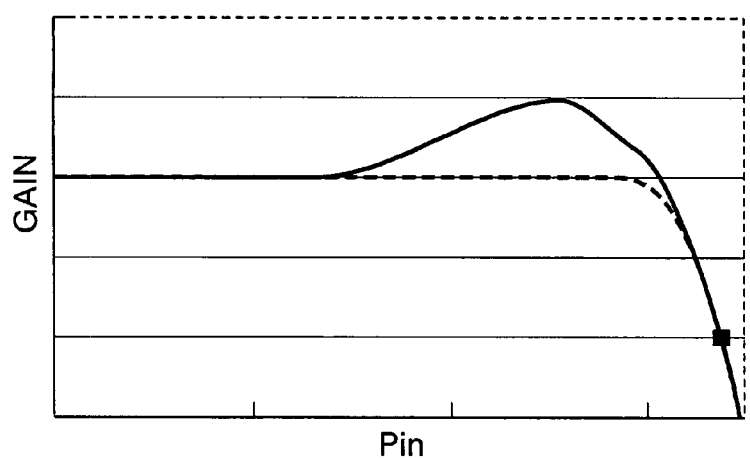
[FIG. 4] A diagram showing a gain characteristic in a case where the linearizer having the gain characteristic shown in FIG. 3 is applied to an amplifier having a gain characteristic shown in FIG. 27.

When the signal power Pin increases, the signal waveform is further clipped by the diode 12 to generate a DC current reverse to the DC current of the diode 8. In other words, when the signal current detected by the diode 12 becomes equal to or larger than predetermined power, the DC current of the diode 8 is limited to reduce the internal resistance of the diode 8. Therefore, the gain Gain reduces. Then, when the signal current becomes equal to or larger than predetermined power, the gain begins to increase. Thus, as shown in FIGS. 2 and 3, the gain characteristic is a valley characteristic in which the gain reduces and then increases with respect to the signal power Pin.

Figure 27:
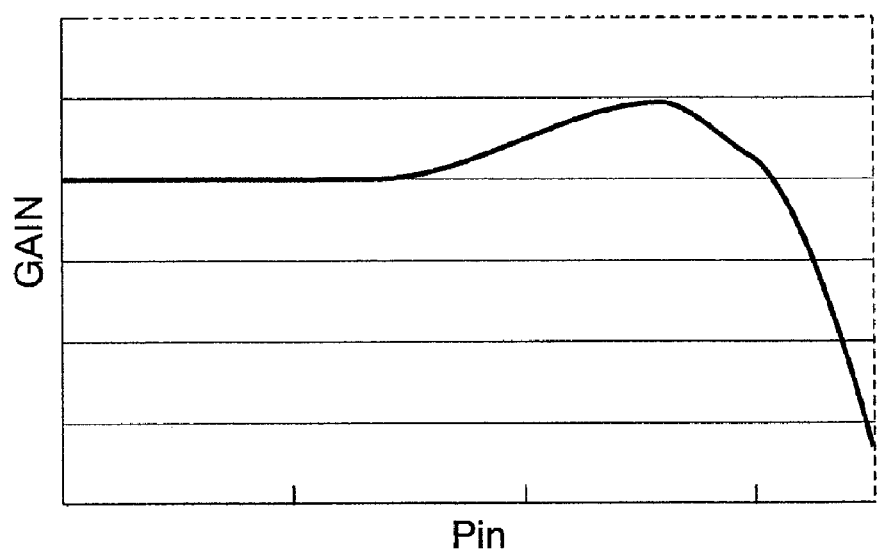
[FIG. 27] A diagram showing a gain characteristic of a normal amplifier.
Figure 28:
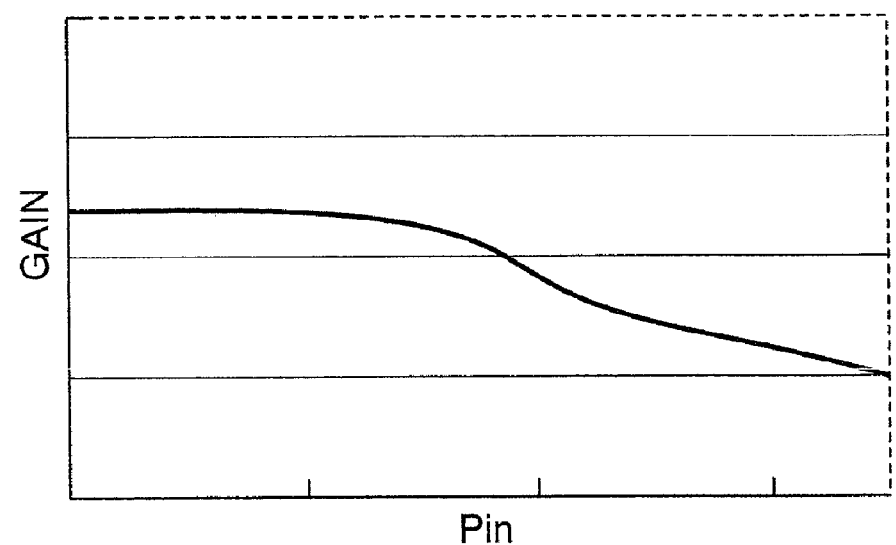
[FIG. 28] A diagram showing a gain characteristic of a conventional linearizer.
Figure 29:
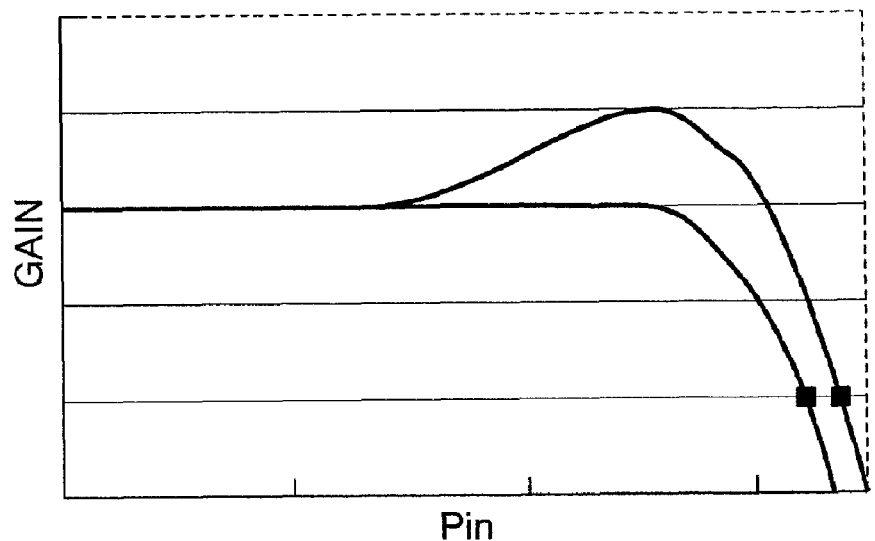
[FIG. 29] A diagram showing a gain characteristic in a case where the linearizer having the gain characteristic shown in FIG. 28 is applied to the amplifier having the gain characteristic shown in FIG. 27.

The linearizer is particularly useful to compensate for the distortion of an amplifier in which the gain rises before saturation as in a case of an AB class amplifier as shown in FIG. 27. This principle is based on the fact that the gain characteristic of the linearizer is the characteristic in which the gain reduces and then increases as shown in FIG. 3, so power, when the gain becomes lower than a linear gain (gain is maintained constant), does not easily reduce before and after the application. Therefore, an input-output characteristic obtained after the application of the linearizer becomes higher than that at a specific compression point after the application of the linearizer according to the first conventional example (see FIGS. 5 and 30).

Figure 5:
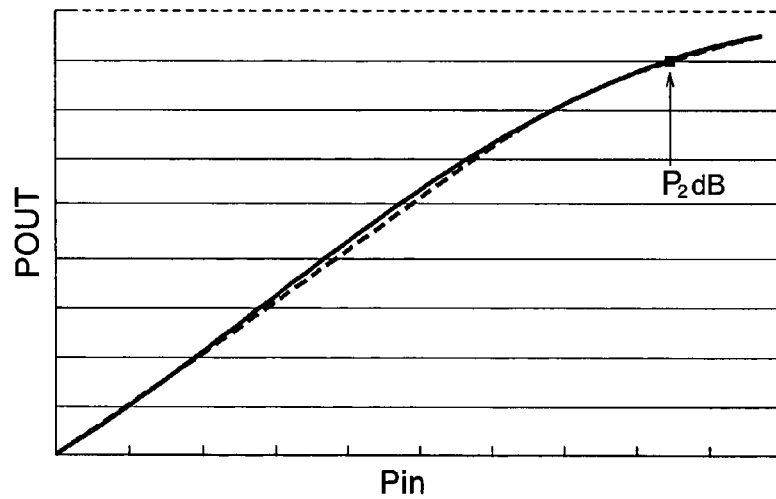
[FIG. 5] A diagram showing an input-output characteristic of the amplifier after the linearizer having the gain characteristic shown in FIG. 3 is applied thereto.
Figure 30:
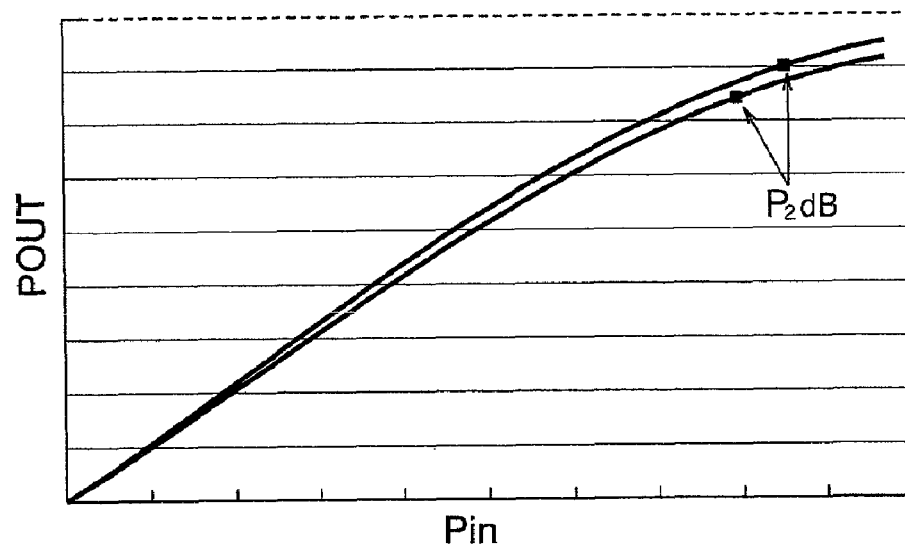
[FIG. 30] A diagram showing an input-output characteristic of the amplifier after the linearizer having the gain characteristic shown in FIG. 28 is applied thereto.

When the distortion of an amplifier having a gain characteristic in which the gain rises is compensated by the linearizer according to the first conventional example, the specific gain compression point before the compensation becomes lower than that after the compensation as shown in FIG. 30. However, when the linearizer according to the present invention is used, as in a case of the input-output characteristic obtained after the distortion compensation as shown in FIG. 5, the linearity of the gain can be improved without the lowering of the specific gain compression point. An advantage that the lowering of the specific gain compression point is prevented occurs in a case where the present invention is used for particularly a feedforward amplifier. This is because, in the feedforward amplifier, when the specific gain compression point lowers, a maximum power point for correcting the distortion also reduces.

Embodiment 2

Figure 6:
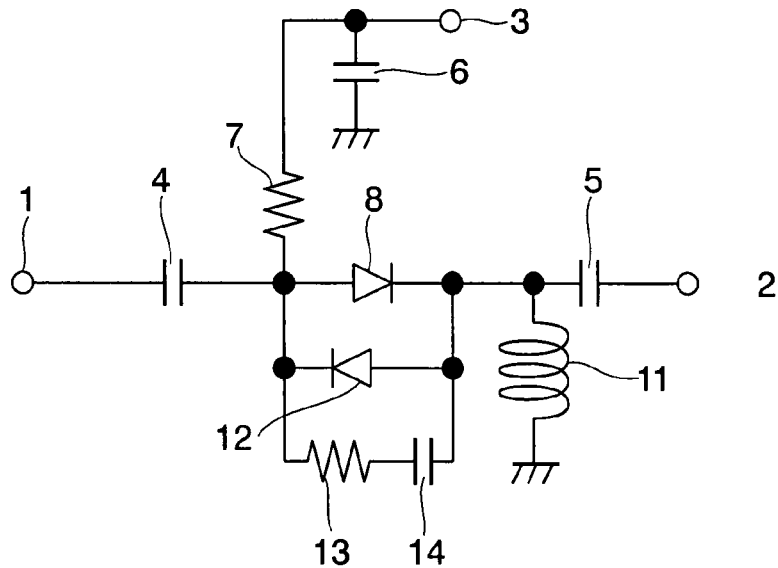
[FIG. 6] A circuit diagram showing a linearizer according to Embodiment 2 of the present invention.

FIG. 6 is a circuit diagram showing a linearizer according to Embodiment 2 of the present invention.

When the linearizer according to Embodiment 2 as shown in FIG. 6 is compared with the linearizer according to Embodiment 1 as shown in FIG. 1, a series-connected member which is composed of a resistor 13 and a capacitor 14 is connected in parallel with the pair of diodes 8 and 12. Other structures are identical to those shown in FIG. 1. Although the series-connected member which is composed of the resistor 13 and the capacitor 14 is connected in parallel with the pair of diodes 8 and 12 as shown in FIG. 6, any one of the resistor 13 and the capacitor 14 may be connected therewith.

Figure 7:
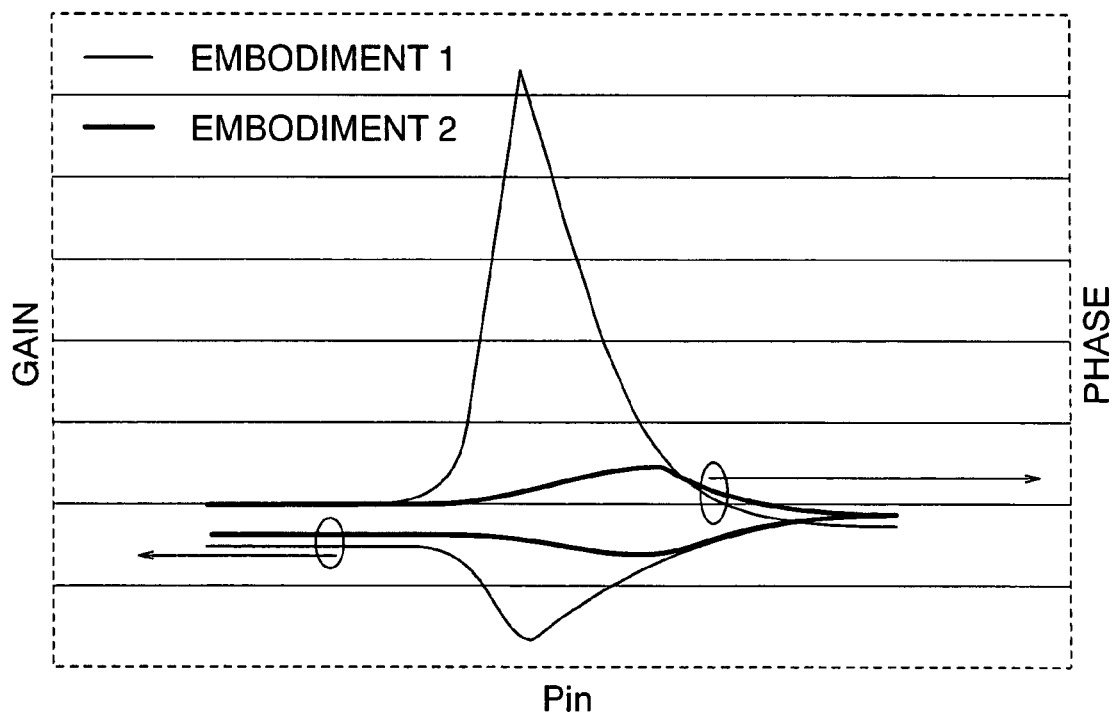
[FIG. 7] A characteristic diagram showing a gain characteristic and a phase characteristic of the linearizer according to Embodiment 2, which are compared with the gain characteristic and the phase characteristic of the linearizer according to Embodiment 1 as shown in FIG. 2.

FIG. 7 is a characteristic diagram showing a gain characteristic and a phase characteristic of the linearizer according to Embodiment 2, which are compared with the gain characteristic and the phase characteristic of the linearizer according to Embodiment 1 as shown in FIG. 2.

According to Embodiment 2, the resistor 13 and the capacitor 14 are further provided in the structure according to Embodiment 1, so the gain characteristic and the phase characteristic can be further adjusted as shown in FIG. 7.

Embodiment 3

Figure 8:
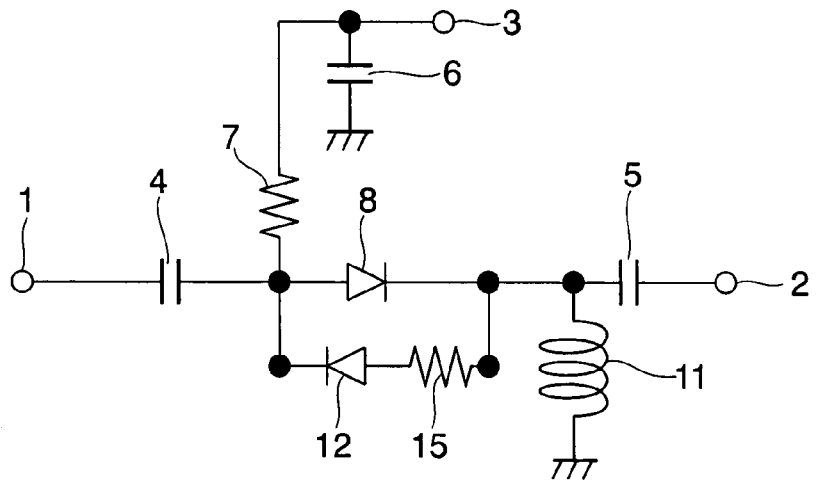
[FIG. 8] A circuit diagram showing a linearizer according to Embodiment 3 of the present invention.

FIG. 8 is a circuit diagram showing a linearizer according to Embodiment 3 of the present invention.

When the linearizer according to Embodiment 3 as shown in FIG. 8 is compared with the linearizer according to Embodiment 1 as shown in FIG. 1, a resistor 15 is connected in series with any one of the pair of diodes 8 and 12, for example, the diode 12 having the opposite polarity, and a connected member which is composed thereof is connected in parallel with the diode 8. Other structures are identical to those shown in FIG. 1. A connection order of the resistor 15 and the diode 12 having the opposite polarity may be reversed. An inductor may be provided instead of the resistor 15.

Figure 9:
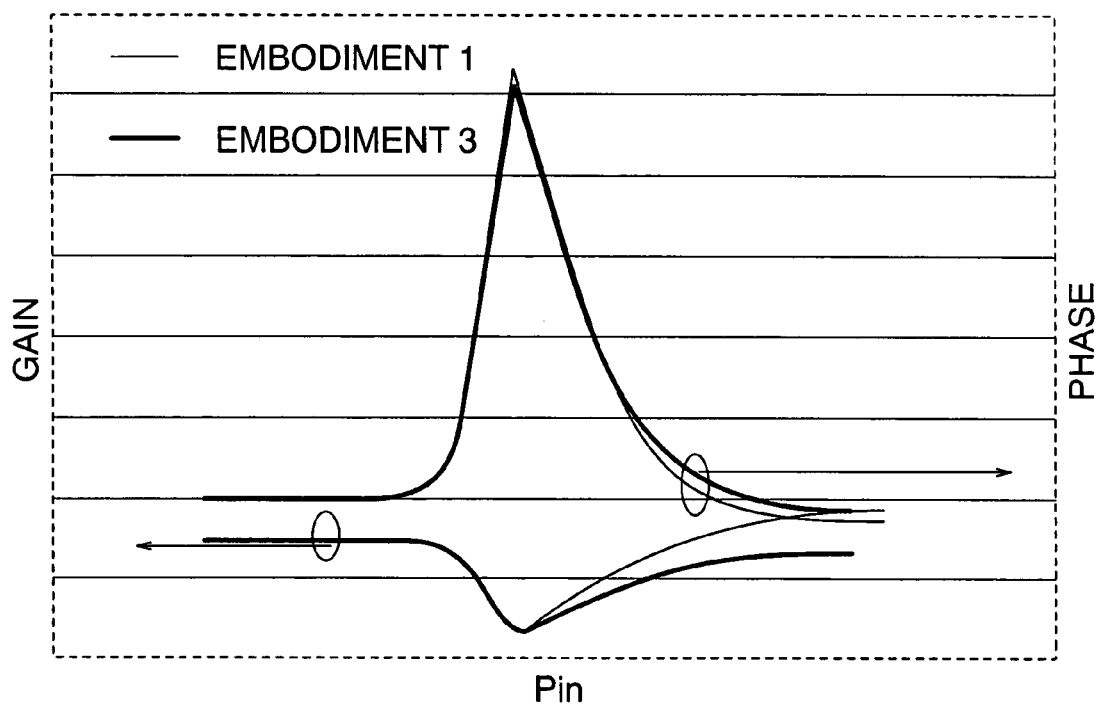
[FIG. 9] A characteristic diagram showing a gain characteristic and a phase characteristic of the linearizer according to Embodiment 3, which are compared with the gain characteristic and the phase characteristic of the linearizer according to Embodiment 1 as shown in FIG. 2.

FIG. 9 is a characteristic diagram showing a gain characteristic and a phase characteristic of the linearizer according to Embodiment 3, which are compared with the gain characteristic and the phase characteristic of the linearizer according to Embodiment 1 as shown in FIG. 2.

According to Embodiment 3, the resistor 15 is capable of adjusting the gradient of increase in the gain characteristic. The resistor 15 acts to suppress the current generated by clipping by the diode 12. Therefore, the amount of gain increase in a valley characteristic can be suppressed as shown in FIG. 9.

Embodiment 4

Figure 10:
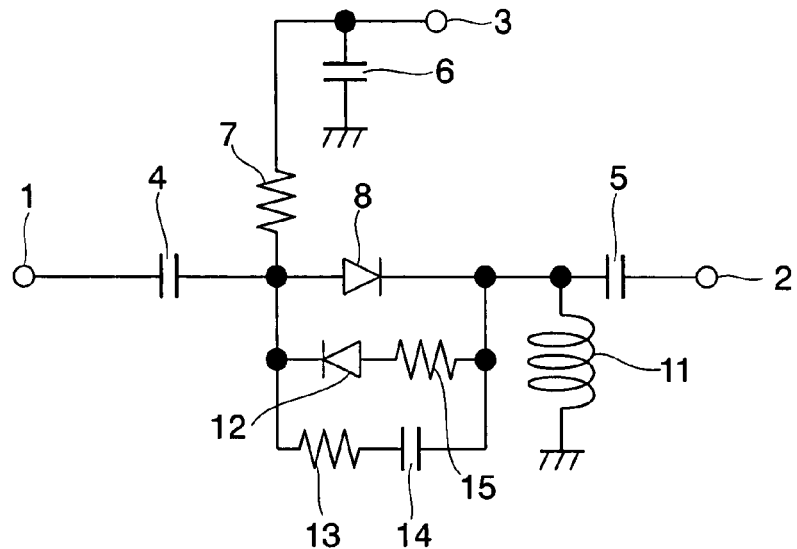
[FIG. 10] A circuit diagram showing a linearizer according to Embodiment 4 of the present invention.

FIG. 10 is a circuit diagram showing a linearizer according to Embodiment 4 of the present invention.

When the linearizer according to Embodiment 4 as shown in FIG. 10 is compared with the linearizer according to Embodiment 2 as shown in FIG. 6, the resistor 15 is connected in series with any one of the pair of diodes 8 and 12, for example, the diode 12 having the opposite polarity, and a connected member which is composed thereof is connected in parallel with the diode 8. Other structures are identical to those shown in FIG. 6. The connection order of the resistor 15 and the diode 12 having the opposite polarity may be reversed. An inductor may be provided instead of the resistor 15.

Figure 11:
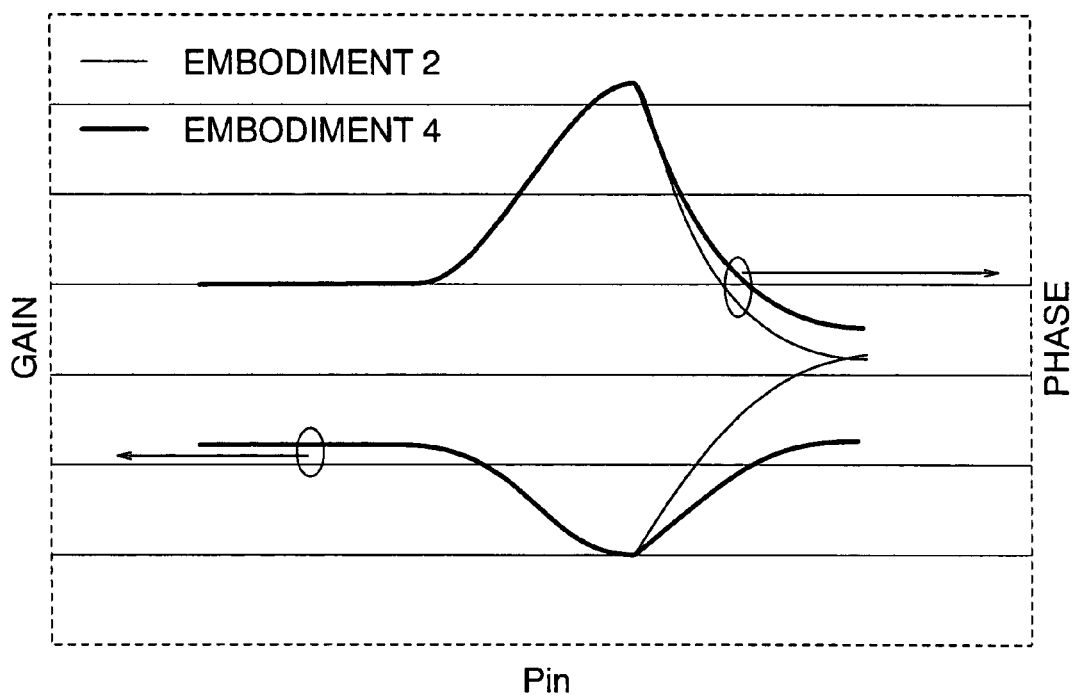
[FIG. 11] A characteristic diagram showing a gain characteristic and a phase characteristic of the linearizer according to Embodiment 4, which are compared with the gain characteristic and the phase characteristic of the linearizer according to Embodiment 2 as shown in FIG. 7.

FIG. 11 is a characteristic diagram showing a gain characteristic and a phase characteristic of the linearizer according to Embodiment 4, which are compared with the gain characteristic and the phase characteristic of the linearizer according to Embodiment 2 as shown in FIG. 7.

According to Embodiment 4, the resistor 15 is provided, so the phase characteristic can be adjusted together with the amount of gain reduction and the amount of gain increase.

Embodiment 5

Figure 12:
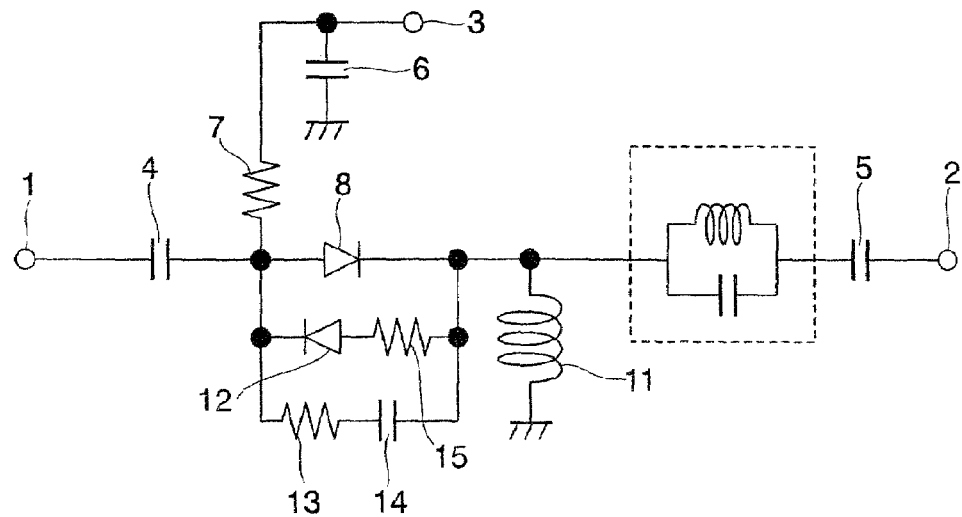
[FIG. 12] A circuit diagram showing a linearizer according to Embodiment 5 of the present invention.

FIG. 12 is a circuit diagram showing a linearizer according to Embodiment 5 of the present invention.

When the linearizer according to Embodiment 5 as shown in FIG. 12 is compared with the linearizer according to Embodiment 4 as shown in FIG. 10, a phase characteristic adjusting circuit which is composed of an inductor and a capacitor is provided on a signal path formed between the DC feed inductor 11 and the bias blocking capacitor 5. Other structures are identical to those shown in FIG. 10. The phase characteristic adjusting circuit may be a circuit which is composed of a resistor, an inductor, and a capacitor instead of the circuit which is composed of the inductor and the capacitor. The circuit may be provided on a signal path formed between the pair of diodes 8 and 12 and the DC feed inductor 11.

Figure 13:
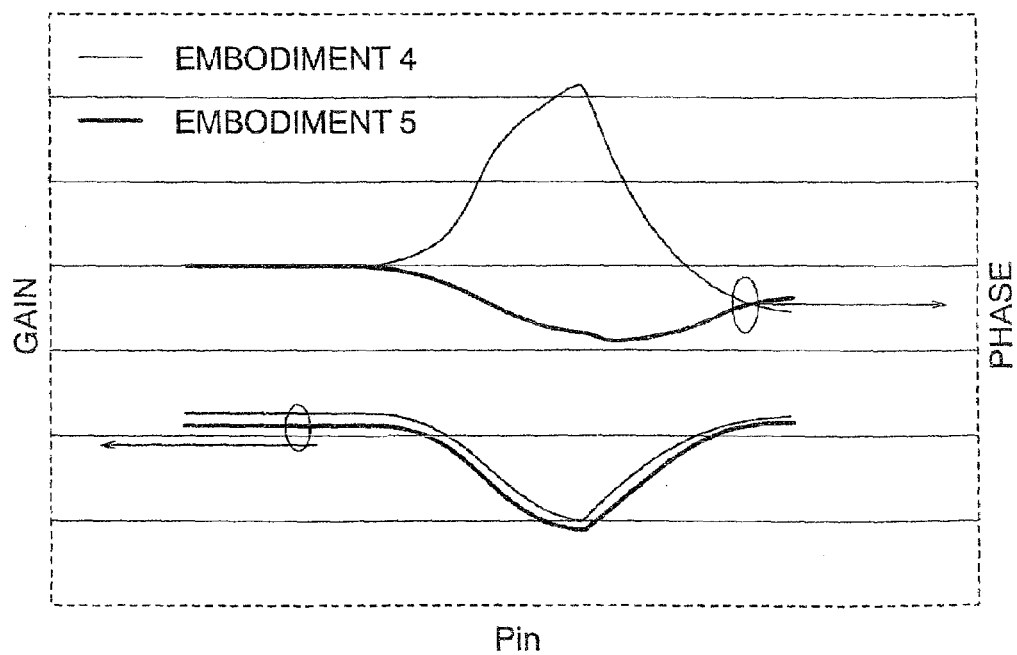
[FIG. 13] A characteristic diagram showing a gain characteristic and a phase characteristic of the linearizer according to Embodiment 5, which are compared with the gain characteristic and the phase characteristic of the linearizer according to Embodiment 4 as shown in FIG. 11.

FIG. 13 is a characteristic diagram showing a gain characteristic and a phase characteristic of the linearizer according to Embodiment 5, which are compared with the gain characteristic and the phase characteristic of the linearizer according to Embodiment 4 as shown in FIG. 11.

According to Embodiment 5, the phase characteristic adjusting circuit is provided, so the phase characteristic can be adjusted as shown in FIG. 13.

Embodiment 6

Figure 14:
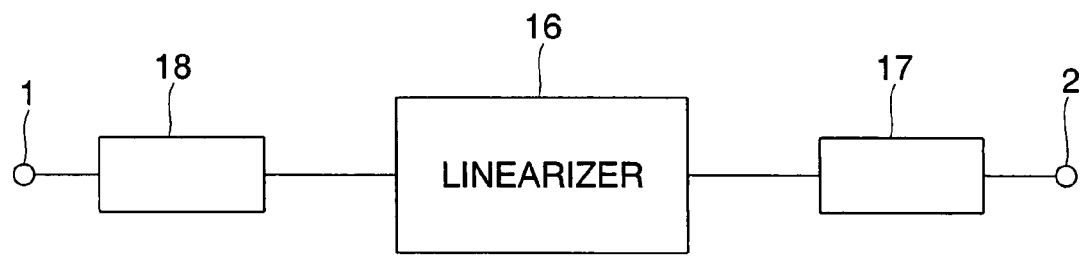
[FIG. 14] A circuit diagram showing a linearizer according to Embodiment 6 of the present invention.

FIG. 14 is a circuit diagram showing a linearizer according to Embodiment 6 of the present invention. In Embodiment 6 shown in FIG. 14, isolators, amplifiers, or attenuators 17 and 18 are provided in signal input and output terminals of a linearizer 16 identical to that according to any one of Embodiments 1 to 4. Note that an isolator, an amplifier, or an attenuator may be provided in any one of the signal input and output terminals of the linearizer 16.

According to such the structure, the influence of an external impedance can be reduced. When the amplifiers are provided in the signal input and output terminals of the linearizer 16, an insertion loss of the linearizer can be compensated by the amplifiers.

Embodiment 7

Figure 15:
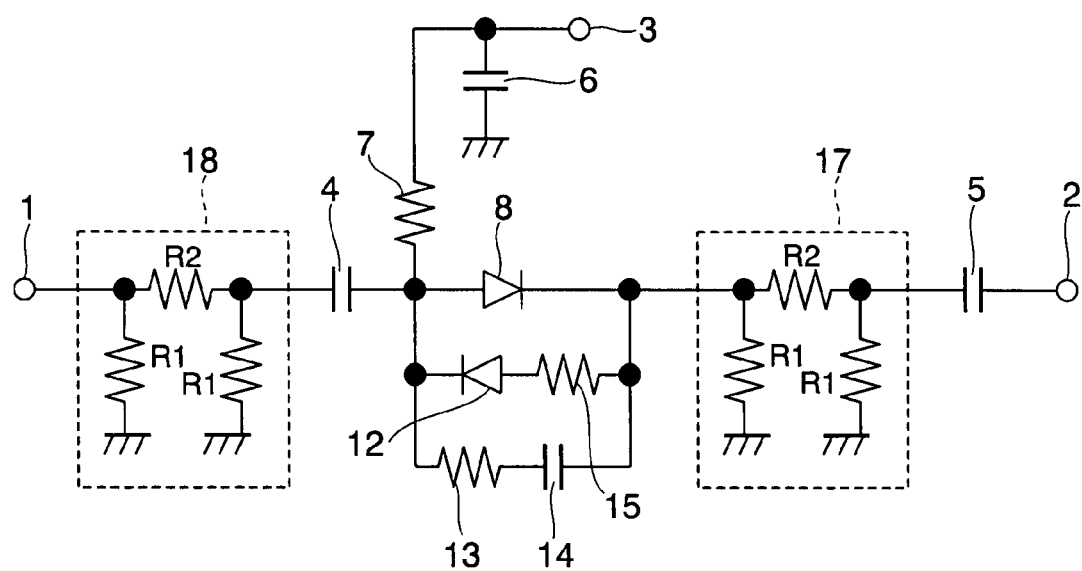
[FIG. 15] A circuit diagram showing a linearizer according to Embodiment 7 of the present invention.

FIG. 15 is a circuit diagram showing a linearizer according to Embodiment 7 of the present invention.

In the linearizer according to Embodiment 7 as shown in FIG. 15, each of the attenuators 17 and 18 provided in the signal input and output terminals of the linearizer 16 according to Embodiment 6 as shown in FIG. 14 is composed of resistors R1 and R2. The output side bias blocking capacitor 5 and the attenuator 17 are exchanged with each other to use the attenuator 17 in place of the DC feed inductor 11.

According to such the structure, the attenuator can be used in place of the inductor 11 to realize a reduction in size. When the attenuator composed of the resistors is used, a change in external impedance as viewed from the linearizer can be suppressed to reduce a frequency characteristic in a wide range.

Embodiment 8

Figure 16:
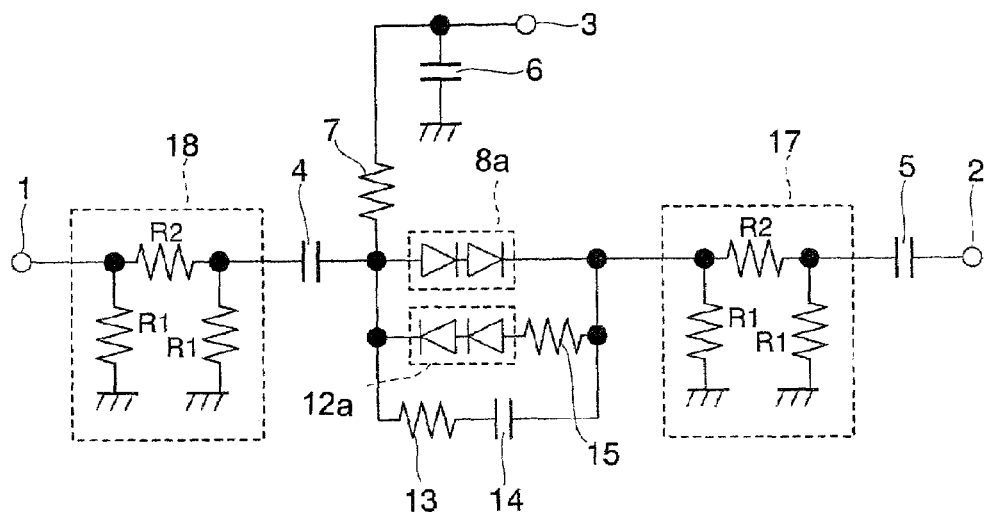
[FIG. 16] A circuit diagram showing a linearizer according to Embodiment 8 of the present invention.

FIG. 16 is a circuit diagram showing a linearizer according to Embodiment 8 of the present invention.

In the linearizer according to Embodiment 8 as shown in FIG. 16, the pair of diodes 8 and 12 of the linearizer according to Embodiment 7 as shown in FIG. 15 are replaced by a pair of series-connected members (8a, 12a), each of which is composed of a plurality of diodes connected in series. Other structures are identical to those shown in FIG. 15.

Figure 17:
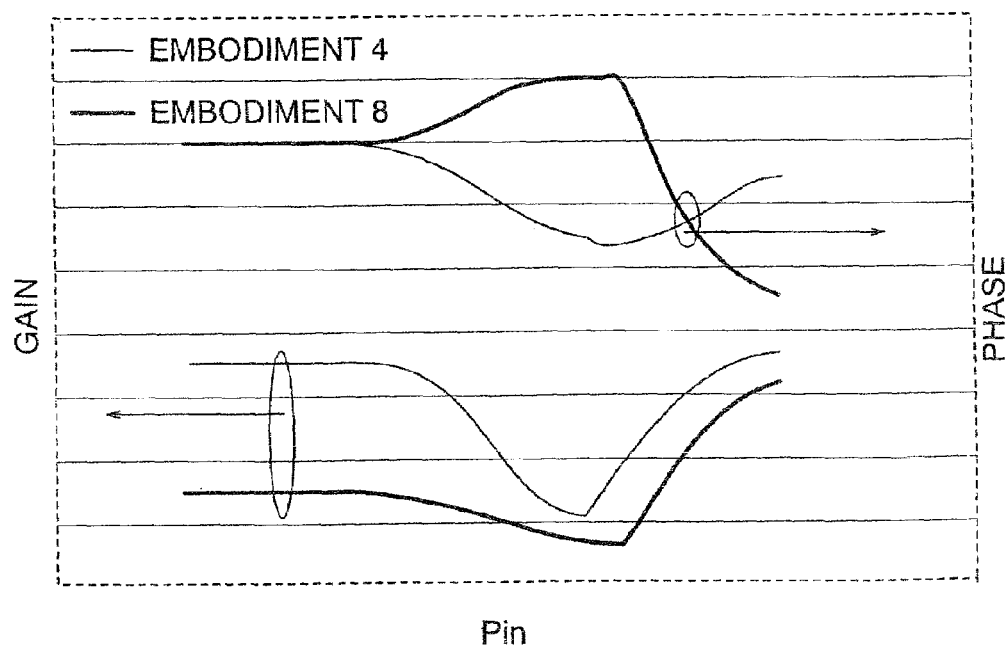
[FIG. 17] A characteristic diagram showing a gain characteristic and a phase characteristic of the linearizer according to Embodiment 8, which are compared with the gain characteristic and the phase characteristic of the linearizer according to Embodiment 4 as shown in FIG. 11.

FIG. 17 is a characteristic diagram showing a gain characteristic and a phase characteristic of the linearizer according to Embodiment 8, which are compared with the gain characteristic and the phase characteristic of the linearizer according to Embodiment 4 as shown in FIG. 11.

According to such the structure, the gain characteristic and the phase characteristic can be adjusted.

A resistor, an inductor, or a capacitor may be connected in series or in parallel with the diodes.

Embodiment 9

Figure 18:
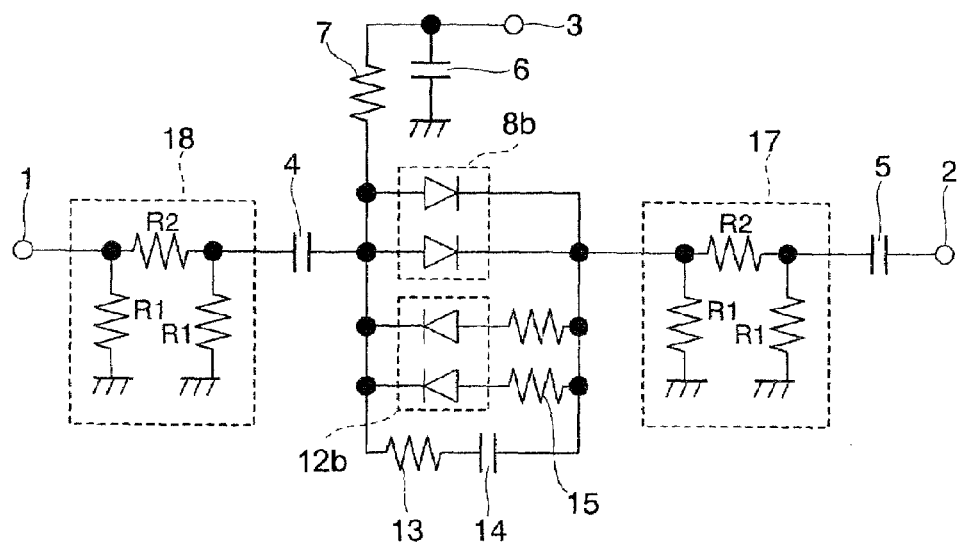
[FIG. 18] A circuit diagram showing a linearizer according to Embodiment 8 of the present invention.

FIG. 18 is a circuit diagram showing a linearizer according to Embodiment 9 of the present invention.

In the linearizer according to Embodiment 9 as shown in FIG. 18, a plurality of pairs, each of which is the pair of diodes 8 and 12 of the linearizer according to Embodiment 7 as shown in FIG. 15, are provided in parallel (8b, 12b). Other structures are identical to those shown in FIG. 15.

Figure 19:
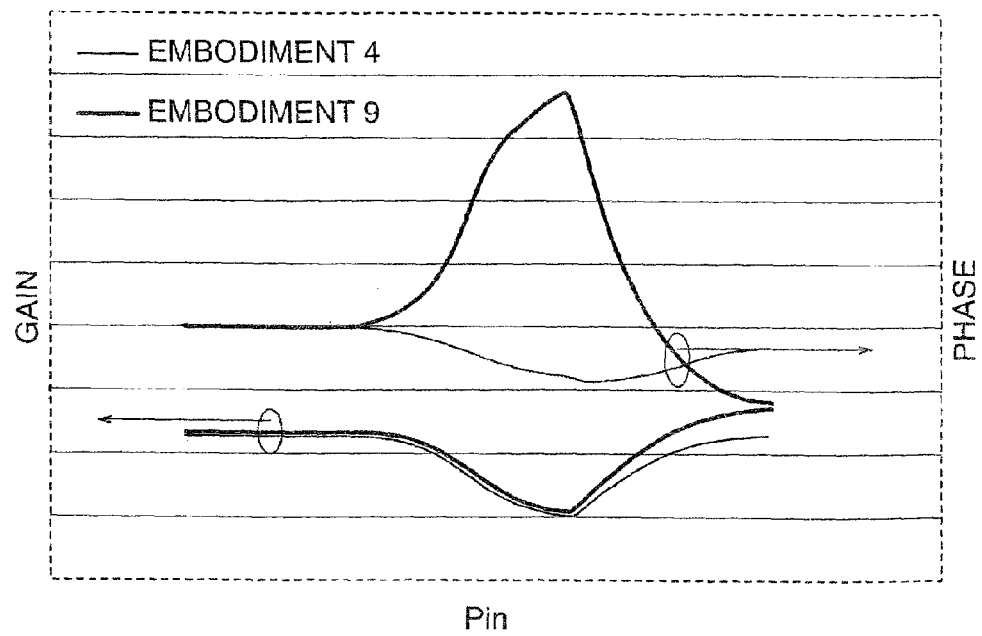
[FIG. 19] A characteristic diagram showing a gain characteristic and a phase characteristic of the linearizer according to Embodiment 9, which are compared with the gain characteristic and the phase characteristic of the linearizer according to Embodiment 4 as shown in FIG. 11.

FIG. 19 is a characteristic diagram showing a gain characteristic and a phase characteristic of the linearizer according to Embodiment 9, which are compared with the gain characteristic and the phase characteristic of the linearizer according to Embodiment 4 as shown in FIG. 11.

According to such the structure, the gain characteristic and the phase characteristic can be adjusted.

A resistor, an inductor, or a capacitor may be connected in series or in parallel with the diodes.

As in Embodiment 8, a plurality of diodes may be provided in series.

Embodiment 10

Figure 20:
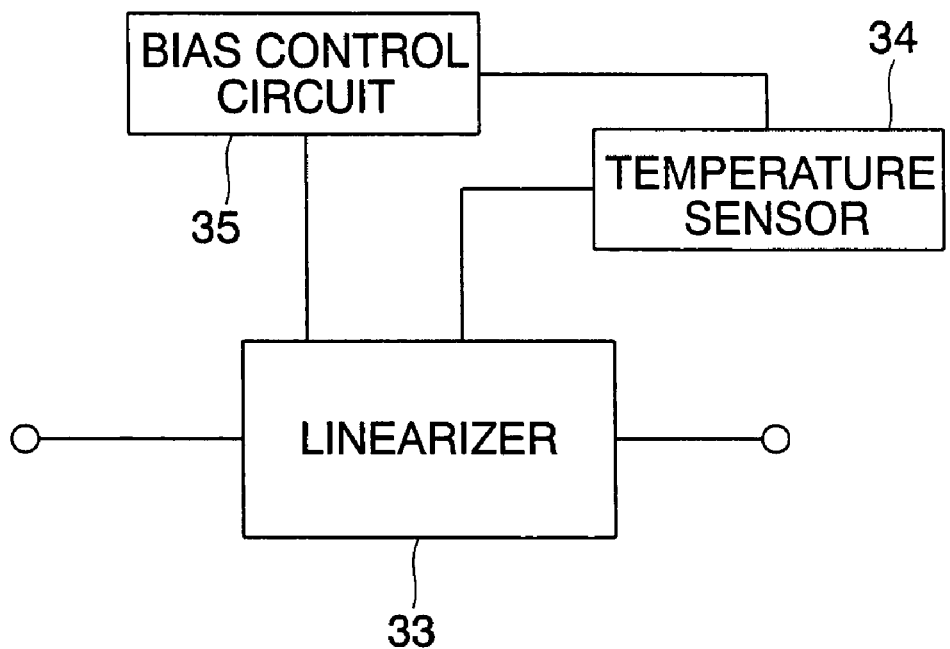
[FIG. 20] A circuit diagram showing a linearizer according to Embodiment 10 of the present invention.

FIG. 20 is a circuit diagram showing a linearizer according to Embodiment 10 of the present invention.

With respect to the linearizer according to Embodiment 10 as shown in FIG. 20, a linearizer 33 according to any one of Embodiments 1 to 9 is provided with a temperature sensor 34 for detecting a temperature of the linearizer, for example, a temperature of the pair of diodes which are main heat generation sources and a bias control circuit 35 for controlling a voltage applied from the bias terminal 3 based on the temperature sent from the temperature sensor 34, a signal inputted into the linearizer 33, and a signal outputted therefrom.

According to such the structure, the gain characteristic and the phase characteristic can be adjusted based on the temperature, the input signal, and the output signal.

Embodiment 11

Figure 21:
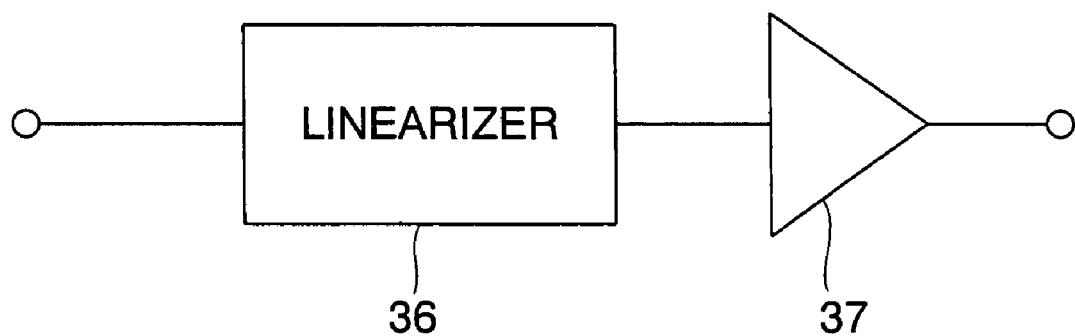
[FIG. 21] A circuit diagram showing a linearizer according to Embodiment 11 of the present invention.

FIG. 21 is a circuit diagram showing a linearizer according to Embodiment 11 of the present invention.

With respect to the linearizer according to Embodiment 11 as shown in FIG. 21, a linearizer 36 according to any one of Embodiments 1 to 10 is connected with a single end amplifier or a push-pull amplifier 37 in the preceding stage. Note that the linearizer 36 may be connected with the single end amplifier or the push-pull amplifier 37 in the subsequent stage thereof.

According to such the structure, the single end amplifier or the push-pull amplifier can be operated with high efficiency and low distortion.

Embodiment 12

Figure 22:
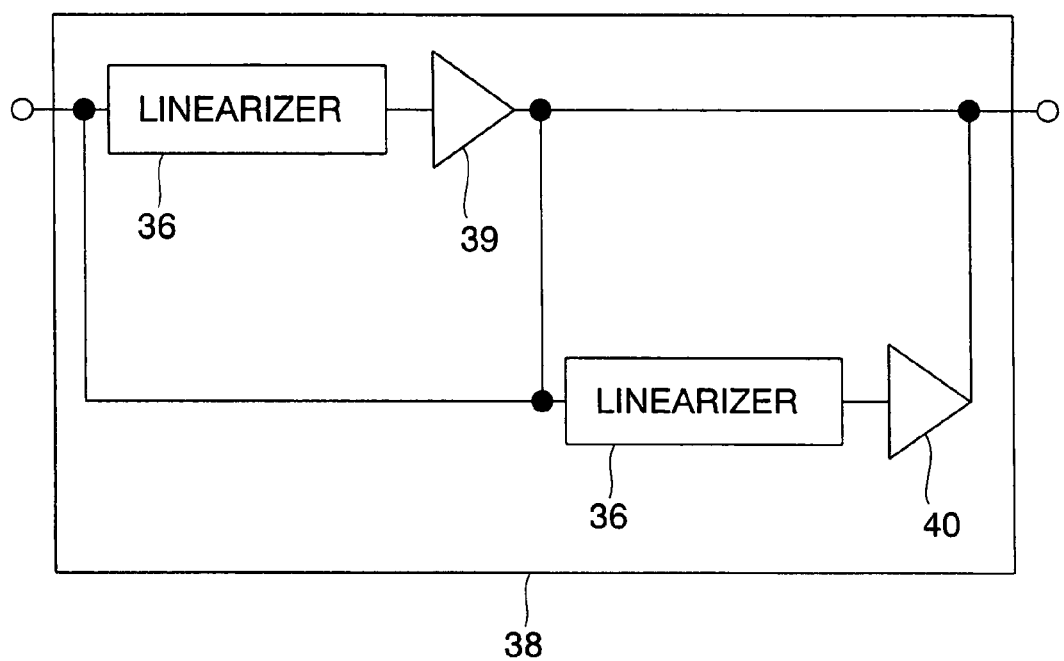
[FIG. 22] A circuit diagram showing a linearizer according to Embodiment 12 of the present invention.
Figure 23:
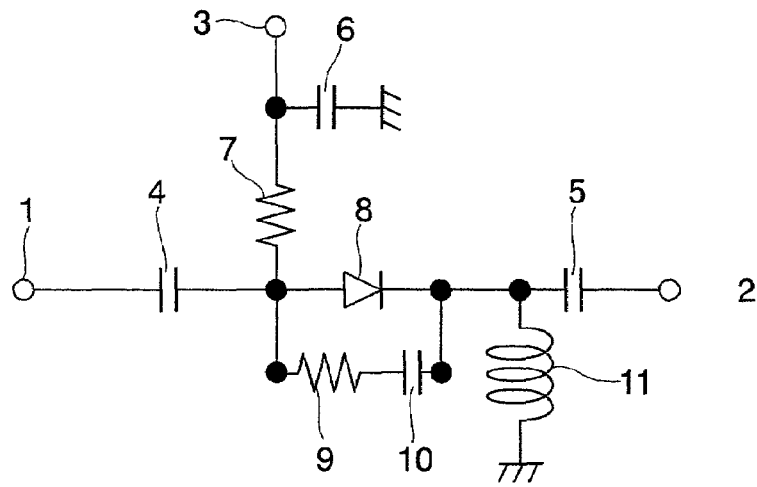
[FIG. 23] A circuit diagram showing a linearizer according to a first conventional example.
Figure 24:
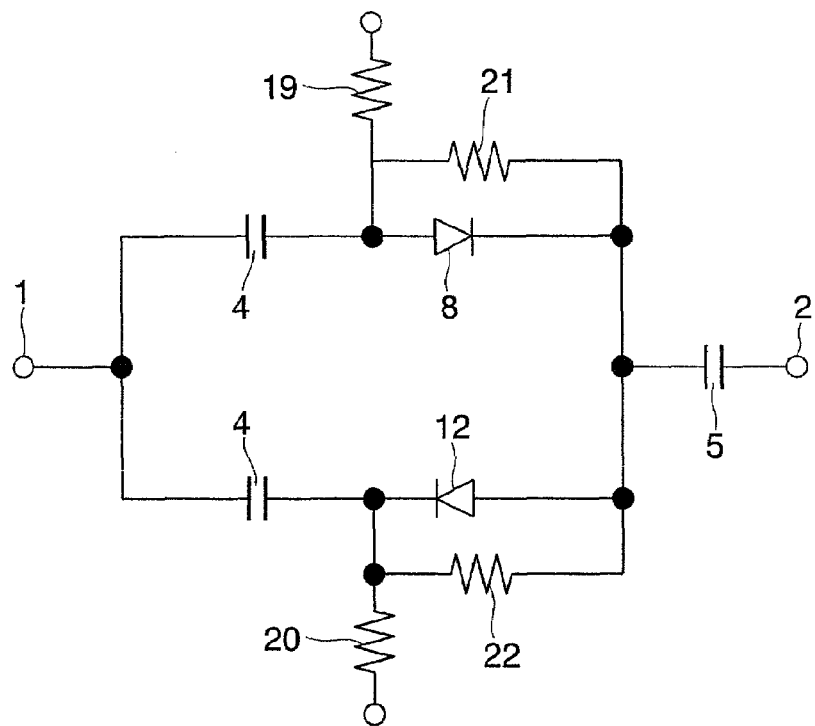
[FIG. 24] A circuit diagram showing a linearizer according to a second conventional example.
Figure 25:
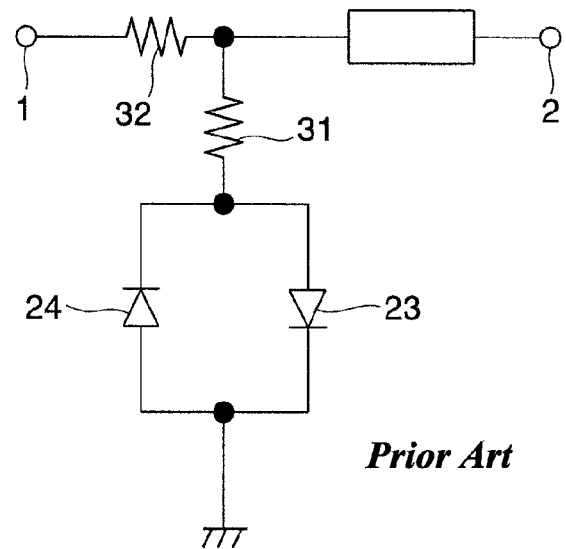
[FIG. 25] A circuit diagram showing a linearizer according to a third conventional example.
Figure 26:
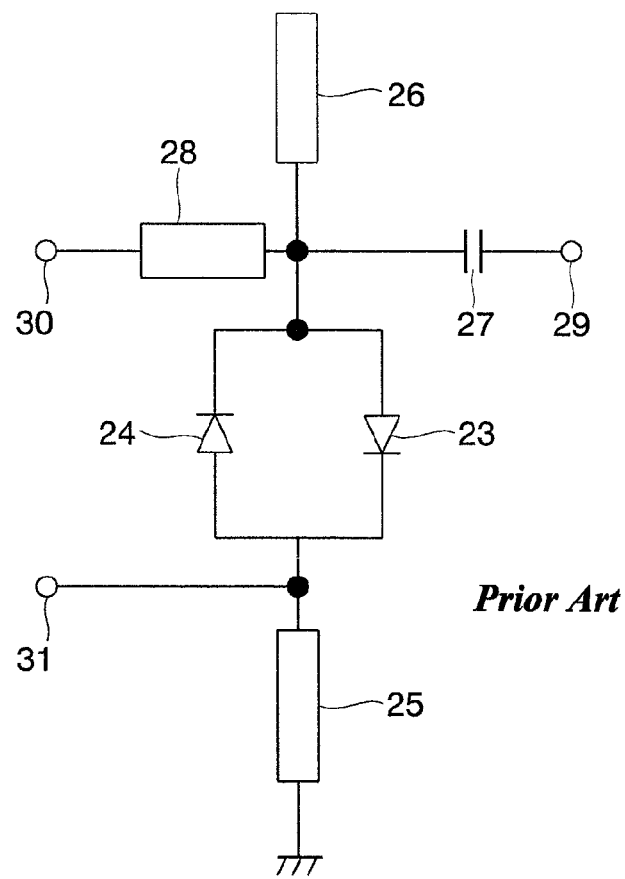
[FIG. 26] A circuit diagram showing a linearizer according to a fourth conventional example.

FIG. 22 is a circuit diagram showing a linearizer according to Embodiment 12 of the present invention.

With respect to the linearizer according to Embodiment 12 as shown in FIG. 22, the linearizer 36 according to any one of Embodiments 1 to 10 is located before each of a main amplifier 39 and an error amplifier 40 which compose a feedforward amplifier 38. The linearizer 36 may be located behind each of the main amplifier 39 and the error amplifier 40 which compose the feedforward amplifier 38.

According to such the structure, the distortion characteristics of the amplifiers 39 and 40 used in the feedforward amplifier 38 are suppressed, so the Distortion characteristics can be further improved.

The invention claimed is:

1. A linearizer, comprising:
   a signal path in which an RF signal input terminal, an input side bias blocking capacitor, a diode pair including diodes having opposite polarities to each other, an output side bias blocking capacitor, and an RF signal output terminal are connected in series in a stated order;
   a bias circuit in which a resistor is provided between a signal path formed between the input side bias blocking capacitor and the diode pair and a bias terminal;
   an RF short-circuit capacitor whose one end is connected with the bias circuit between the bias terminal and the resistor and whose other end is grounded; and
   a DC feed inductor whose one end is connected with a signal path formed between the diode pair and the output side bias blocking capacitor and whose other end is grounded,
   wherein said diodes cause a gain having a valley characteristic in which the gain reduces and then increases when a signal current detected by at least one of said diodes becomes larger than a predetermined power.

2. The linearizer according to claim 1, characterized in that at least one of a resistor and a capacitor is connected in parallel with the diode pair.

3. The linearizer according to claim 1, characterized in that a resistor or an inductor is connected in series with at least one of the diodes of the diode pair.

4. The linearizer according to claim 2, characterized in that a resistor or an inductor is connected in series with at least one of the diodes of the diode pair.

5. The linearizer according to claim 4, characterized in that a phase characteristic adjusting circuit includes a resistor, an inductor, or a capacitor between one of a signal path between the diode pair and the DC feed inductor, and a signal path between the DC feed inductor and the output side bias blocking capacitor.

6. The linearizer according to claim 1, characterized in that an attenuator, an isolator, or an amplifier is provided in at least one of the input terminal and the output terminal.

7. The linearizer according to claim 6, characterized in that the attenuator comprises resistors.

8. The linearizer according to claim 7, characterized in that the diode pair comprises a pair of connected members, each of which includes a plurality of diodes connected in series.

9. The linearizer according to claim 7, characterized by in that a plurality of the diode pairs are provided in parallel.

10. The linearizer according to claim 1, characterized by further comprising:
    a temperature sensor for detecting a temperature of the linearizer; and
    a bias control circuit for controlling a bias voltage applied to the diode pair based on the temperature detected by the temperature sensor, a signal inputted into the linearizer, and a signal outputted therefrom.

11. The linearizer according to claim 1, characterized in that the linearizer is connected with a single end amplifier or a push-pull amplifier in a preceding stage or a subsequent stage of the amplifiers.

12. The linearizer according to claim 1, characterized in that the linearizer is located before or behind an amplifier included in a feed forward amplifier.

* * * * *